United States Patent
Jung et al.

(10) Patent No.: US 7,030,701 B2
(45) Date of Patent: Apr. 18, 2006

(54) TRANSIMPEDANCE AMPLIFICATION APPARATUS WITH SOURCE FOLLOWER STRUCTURE

(75) Inventors: Dong Yun Jung, Gyeonggi-do (KR); Sang-Hyun Park, Daejeon (KR); Chul Soon Park, Daejeon (KR)

(73) Assignee: Information and Communications University Educational Foundation, Seoul (KR)

( * ) Notice: Subject to any disclaimer, the term of this patent is extended or adjusted under 35 U.S.C. 154(b) by 77 days.

(21) Appl. No.: 10/735,738

(22) Filed: Dec. 16, 2003

(65) Prior Publication Data

US 2004/0124927 A1     Jul. 1, 2004

(30) Foreign Application Priority Data

Dec. 16, 2002    (KR)    ................... 10-2002-0080153

(51) Int. Cl.
*H03F 3/08* (2006.01)

(52) U.S. Cl. ................. 330/308; 330/277; 330/291

(58) Field of Classification Search .............. None
See application file for complete search history.

(56) References Cited

U.S. PATENT DOCUMENTS

| 5,025,226 A | * | 6/1991 | Taylor | ................. 330/277 |
| 5,352,992 A | * | 10/1994 | Asazawa | ................. 330/291 |
| 5,952,887 A | * | 9/1999 | Katayanagi et al. | ........ 330/308 |
| 6,593,813 B1 | * | 7/2003 | Matsushita | ................. 330/265 |

* cited by examiner

*Primary Examiner*—Khanh V. Nguyen
(74) *Attorney, Agent, or Firm*—Bacon & Thomas, PLLC

(57) ABSTRACT

A transimpedance amplification apparatus includes a signal source for generating a current signal, a source follower stage, a common source stage and a shunt feedback resistor. The source follower stage having a source follower structure receives the current signal to reduce an impedance of the signal source. The common source stage, following the source follower stage, driven by the reduced signal source impedance, amplifies the current signal to extend a frequency bandwidth of the current signal and buffers the amplified signal with the extended frequency bandwidth thereof maintained, wherein the reduced signal source impedance serves to extend a frequency bandwidth of the common source stage. The shunt feedback resistor, which is installed between the source follower stage and the common source stage, adjusts an input DC bias of the source follower stage and increasing a transimpedance gain of the common source stage.

7 Claims, 4 Drawing Sheets

TRANSIMPEDANCE AMPLIFICATION APPARATUS WITH SOURCE FOLLOWER STRUCTURE

FIELD OF THE INVENTION

The present invention relates to a transimpedance amplification apparatus in an optical communications system; and, more particularly, to a transimpedance amplification apparatus with a source follower structure for extending a frequency bandwidth thereof without additional passive devices.

BACKGROUND OF THE INVENTION

Recently, ultrahigh-speed data communications techniques, e.g., an optical communications technique using an optical fiber, have advanced rapidly, but demand for transmission of a growing amount of data keeps getting stronger, too. To transmit a larger amount of data, it is necessary to implement a broadband amplification system operating at a wider frequency bandwidth. For this purpose, an active element capable of stably operating in an ultrahigh frequency band has to be developed. Moreover, it is also important to know how to install a newly developed element and others in a broadband amplifier circuit, i.e., to improve the way to design a broadband amplifier circuit in order to make the newly developed elements function effectively. The front-end of an optical communication receiver includes a photodetector, which converts an optical signal into an electrical current signal, and a preamplifier for extending a frequency bandwidth.

One of key components in the broadband amplification system is the preamplifier. A common source transimpedance amplifier (TIA) is usually used as the preamplifier.

FIG. 1 shows a circuit diagram of a conventional common source TIA 100, which includes a plurality of transistors 10, 20, 24 and 30, a multiplicity of resistors 12, 14, 18, 22, 26, 28 and 32 and a power supply 16.

The conventional common source TIA 100 amplifies a current signal inputted thereto by means of four-part transistors 10, 20, 24 and 30, thereby outputting a voltage signal. That is, the transistor 10, a first amplifying transistor, basically amplifies the current signal and the transistor 20, a first buffer transistor, buffers the amplified signal. Thereafter, the transistor 24, a second amplifying transistor, secondarily amplifies the buffered signal from the first buffer transistor 20 and then the transistor 30, a second buffer transistor, buffers the secondarily amplified signal.

A wide frequency bandwidth is one of the most important characteristics to be considered in designing a high-speed optical communications system, especially, TIA. However, it is not easy to extend a frequency bandwidth of the conventional common source TIA as much as required by the optical communications system. Accordingly, many schemes, e.g., gain peaking techniques using passive devices of inductors or capacitors, have been proposed.

A shunt inductive-peaking scheme, one of the most frequently used techniques, connects an inductor to a drain of the first and/or the second amplifying transistor in the conventional common source TIA 100, resulting in a resonance with parasitic capacitances. Although the shunt inductive-peaking scheme extends the frequency bandwidth, stray capacitances of on-chip-inductor often cause a bad influence upon bandwidth increment. The shunt inductive-peaking scheme has further problem in that self-resonant frequency (SRF) and Q-value of the inductor greatly limit on high-frequency applications.

Another method for wideband design is a capacitive-peaking scheme, in which a capacitor is coupled to the resistor 22, in parallel at the source of the first buffer transistor 20 of the conventional common source TIA 100. In the result, an extra pole is added to a transfer function of the conventional common source TIA 100 so that the frequency bandwidth may be extended. However, this method also has serious problems due to the variation of capacitance caused by parasitic pad capacitance and process variation.

Therefore, it is desirable to develop a TIA capable of extending the frequency bandwidth without regard to SRF and Q-value of an inductor and simultaneously less sensitive to parasitic pad capacitance and process variation.

SUMMARY OF THE INVENTION

It is, therefore, an object of the present invention to provide a transimpedance amplification apparatus of a source follower structure capable of extending the frequency bandwidth by reducing source impedance in an input node without regard to SRF and Q-value of an inductor and simultaneously less sensitive to parasitic pad capacitance and process variation.

In accordance with the present invention, there is provided a transimpedance amplification apparatus with a signal source for generating a current signal, which includes: a source follower stage having a source follower structure, for receiving the current signal to reduce an impedance of the signal source; a common source stage, following the source follower stage, driven by the reduced signal source impedance, for amplifying the current signal to extend a frequency bandwidth of the current signal and buffering the amplified signal with the extended frequency bandwidth thereof maintained, wherein the reduced signal source impedance serves to extend a frequency bandwidth of the common source stage; and a shunt feedback resistor, which is installed between the source follower stage and the common source stage, for adjusting an input DC bias of the source follower stage and increasing a transimpedance gain of the common source stage.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 2:
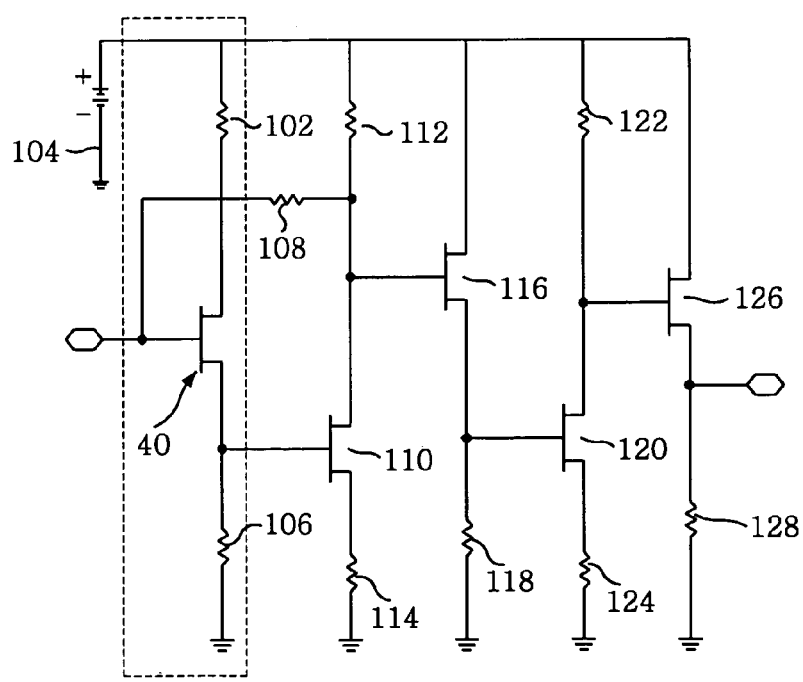
FIG. 2 depicts a circuit diagram of a source follower TIA in accordance with a preferred embodiment of the present invention.

FIG. 2 describes a circuit diagram of a source follower transimpedance amplifier (TIA) 400 in accordance with a preferred embodiment of the present invention, which includes a plurality of transistors 40, 110, 116, 120 and 126, a multiplicity of resistors 102, 106, 108, 112, 114, 118, 122, 124, and 128 and a power supply 104.

The transistor 40, an input transistor which has a source follower structure, in an input node of the source follower TIA 400 forms a source follower stage of the source follower TIA 400 as represented by a dotted line and the transistors 110, 116, 120 and 126 following the source follower stage form a common source stage of the source follower TIA 400.

The input transistor 40 receives a current signal from a signal source (not shown) and forwards the current signal to the common source stage. The input transistor 40 serves to drop a signal source impedance seen across the common source stage. The signal source impedance seen across the common source stage is smaller than that seen across the input transistor 40.

The small signal source impedance serves to extend a frequency bandwidth. The effect of the signal source impedance will be described later.

A gate of the input transistor 40 is connected to a drain of the transistor 110 via a shunt feedback resistor 108, while a drain of the input transistor 40 is coupled to the power supply 104 via a resistor 102 and a source of the input resistor 40 is grounded via a resistor 106.

The shunt feedback resistor 108, which is installed between the gate of the input transistor 40 and a drain of the transistor 110, serves to adjust an input DC bias for a gate voltage of the input transistor 40.

The transistor 110 as a first amplifying stage basically amplifies the current signal forwarded from the source follower stage to extend a frequency bandwidth of the current signal. A gate of the first amplifying transistor 110 is connected to the source of the input transistor 40, while a drain of the first amplifying transistor 110 is coupled to the power supply 104 via a resistor 112 and a source of the first amplifying transistor 110 is grounded via the resistor 114.

Generally, because a single amplifying stage usually cannot provide sufficient gain, other amplifying stage, e.g., a second amplifying stage, may be required. In this case, the transistor 116 may be prepared between the first amplifying stage and the second amplifying stage, to function like as a first buffer stage for buffering the basically amplified signal with the frequency bandwidth thereof maintained. A gate of the first buffer transistor 116 is connected to the drain of the first amplifying transistor 110, while a drain of the first buffer transistor 116 is coupled to the power supply 104 and a source of the first buffer transistor 116 is grounded via the resistor 118.

The transistor 120 is used as the second amplifying transistor for secondarily amplifying the buffered signal from the first buffer transistor 116, thereby extending a frequency bandwidth of the buffered signal. A gate of the second amplifying transistor 120 is connected to the source of the first buffer transistor 116, while a drain of the second amplifying transistor 120 is coupled to the power supply 104 via the resistor 122 and a source of the second amplifying transistor 120 is grounded via the resistor 124.

The transistor 126 in an output node of the source follower TIA 400 is used as a second buffer stage for delivering the secondarily amplified signal with the frequency bandwidth thereof maintained and simultaneously adjusting the output impedance of the source follower TIA 400 to be a predetermined value, e.g., 50Ω. A gate of the second buffer transistor 126 is connected to the drain of the second amplifying transistor 120, while a drain of the second buffer transistor 126 is coupled to the power supply 104 and a source of the second buffer transistor 126 is grounded via the resistor 128.

In accordance with the present invention, the source follower stage is installed in front of the common source stage, thereby reducing the source impedance seen across the common source stage. The reduced source impedance affects the common source stage to output a signal with an extended frequency bandwidth.

Such characteristics will be described hereinafter with reference to FIGS. 3 to 4B.

Figure 1:
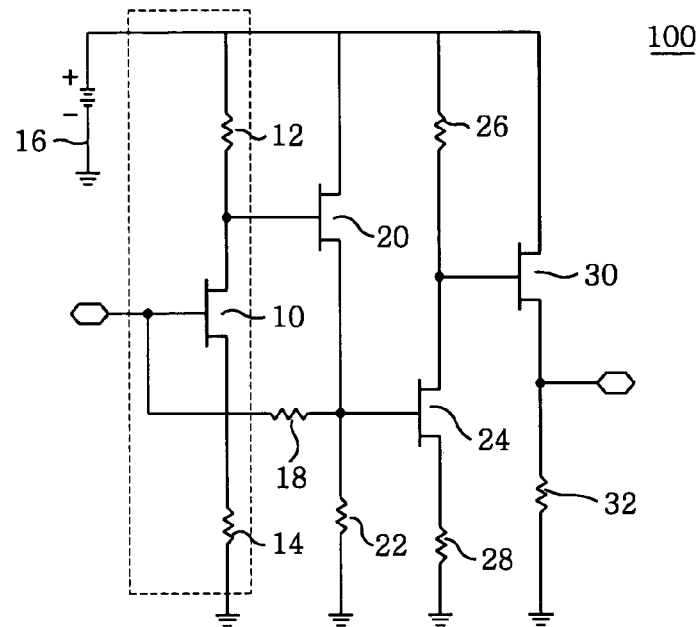
FIG. 1 shows a circuit diagram of a conventional common source transimpedance amplifier (TIA)
Figure 3:
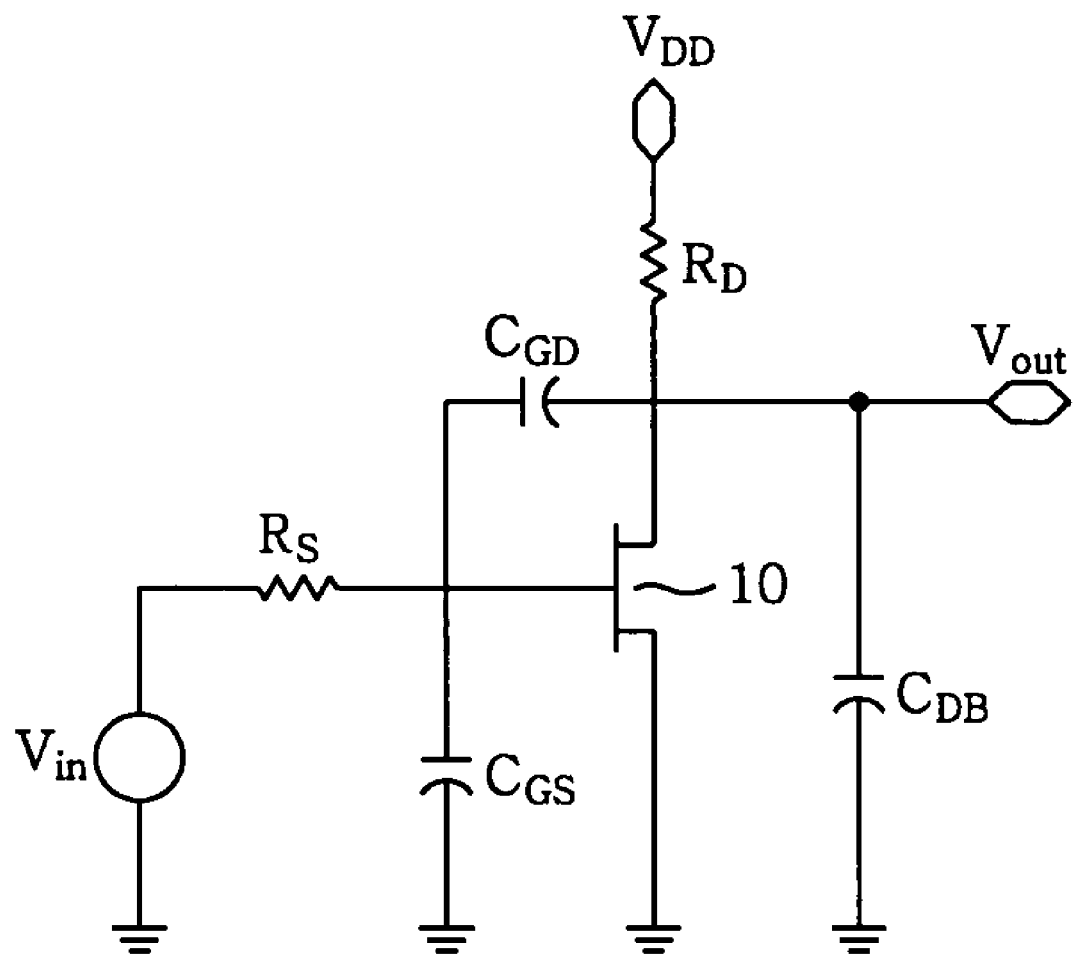
FIG. 3 is a high frequency model of a first amplifying part shown in FIG. 1.

FIG. 3 is a high frequency model of a first amplifying part, driven by $R_S$, represented by a dotted line in a conventional common source TIA 100 shown in FIG. 1, wherein $R_S$ is a signal source impedance seen across a gate of the transistor 10.

The first amplifying part in the conventional common source TIA 100 has an input frequency magnitude $\omega_{in}$ given as follows:

$$\omega_{in} = \frac{1}{R_S[C_{GS} + (1 + g_m R_D)C_{GD}]}, \quad \text{Eq. 1}$$

wherein $C_{GS}$ is a capacitance between a gate and a source of the transistor 10; $C_{GD}$ is a capacitance between the gate and a drain of the transistor 10; $g_m$ is a transconductance of the transistor 10; and $R_D$ is a drain resistance of the transistor 10.

As seen from Eq. 1, the input frequency magnitude $\omega_{in}$ is in inverse proportion to the signal source impedance Rs. That is, the less the signal source impedance $R_S$ is, the better the frequency bandwidth characteristics at the high-frequency range is.

Figure 4A:
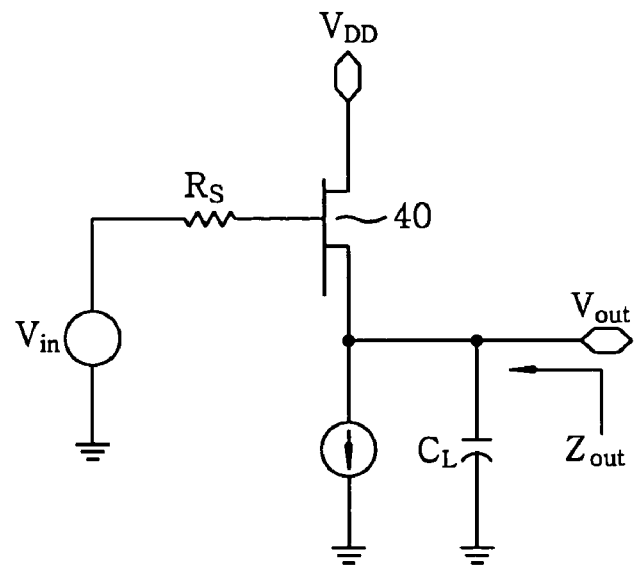
FIGS. 4A and 4B offer a high frequency model of a source follower stage shown in FIG. 2 and an equivalent circuit diagram for describing output impedance thereof, respectively.
Figure 4B:
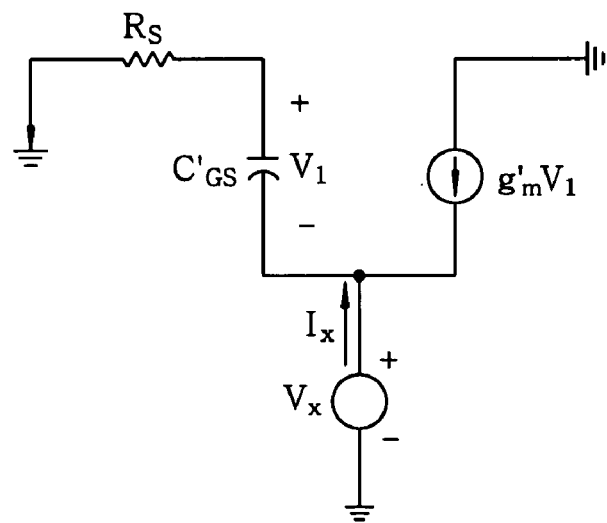

FIG. 4A shows a high frequency model of a source follower stage, represented by a dotted line in FIG. 2, while FIG. 4B offers an equivalent circuit diagram of the high frequency model shown in FIG. 4A for finding an output impedance of the source follower stage, wherein $C_L$ represents a total capacitance of the source follower stage seen at the output node of the high frequency model.

The source follower stage has the output impedance, which is considered at an output end of the high frequency model, as follows:

$$Z_{out} = \frac{sR'_S C'_{GS} + 1}{g'_m + sC'_{GS}}, \quad \text{Eq. 2}$$

wherein $R_S$ is a signal source impedance seen across a gate of the transistor 40; $C_{GS}'$ is a capacitance between a gate and a source of the transistor 40; $g_m'$ is a transconductance of the transistor 40; and "s" is a complex frequency parameter.

The output impedance $Z_{out}$ of the source follower stage is approximately $Z_{out} \approx 1/g_m'$ in a low frequency range and $Z_{out} \approx R_S$ in an infinite frequency. And, $1/g_m'$ is generally less than $R_S$. When frequency is infinite in an ideal case, the output impedance $Z_{out}$ of the source follower stage equals the signal source impedance $R_S$.

Because the source follower stage is installed in front of the common source stage including the first amplifying stage similar to a first amplifying part shown FIGS. 1 and 3, the signal source impedance seen across a gate of the first amplifying transistor 110 is to be $Z_{out}$.

As seen from Eq. 2, the output impedance $Z_{out}$ is always smaller than $R_S$ unless a frequency is infinite. Therefore, the source follower stage renders that the first amplifying stage has a signal source impedance smaller than that of the first amplifying part, thereby extending the frequency bandwidth of the common source stage.

When a transimpedance gain of the source follower TIA 400 is equal to that of the conventional common source TIA 100, the frequency bandwidth of the source follower TIA 400 is greater than that of the conventional common source TIA 100. The frequency bandwidth of the source follower TIA 400 is also greater than those of a prior art shunt inductive-peaking TIA and a prior art capacitive-peaking TIA if the prior art shunt inductive-peaking, the prior art capacitive-peaking TIA and the source follower TIA 400 have same transimpedance gain. Such frequency bandwidth characteristics will be described hereinafter with reference to FIGS. 5 and 6.

Figure 5:
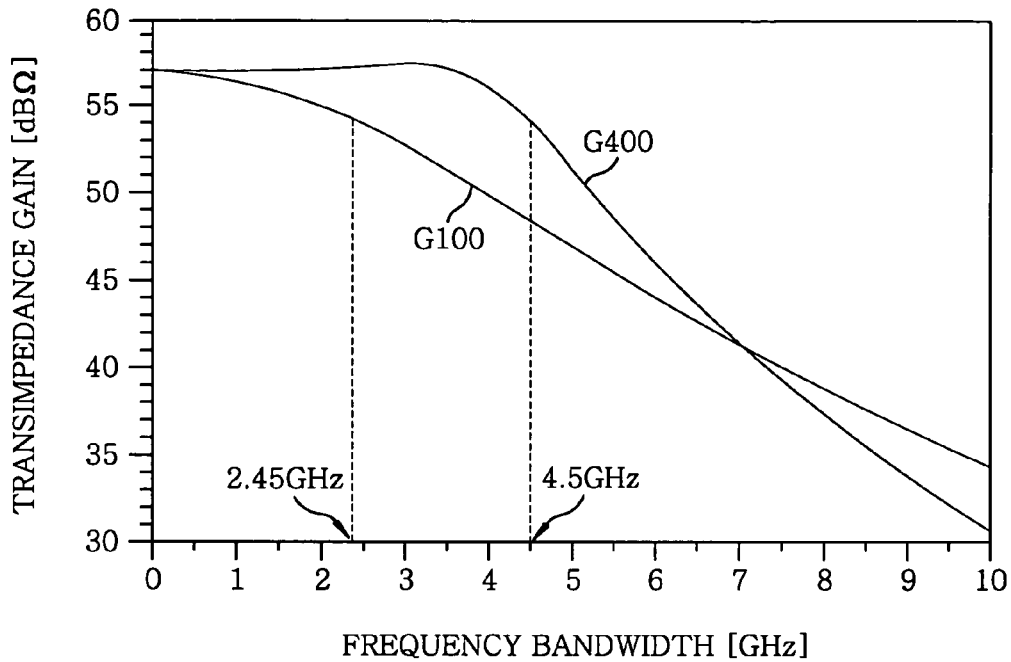
FIG. 5 provides graphs for illustrating a frequency bandwidth of the conventional common source TIA and the source follower TIA of the present invention, respectively.

FIG. 5 provides simulation results for illustrating frequency bandwidths of the conventional common source TIA 100 and the source follower TIA 400 of the present invention, wherein the longitudinal axis represents a transimpedance gain [dBΩ] and the horizontal axis represents a frequency bandwidth [GHz].

For a transimpedance gain of 57 dBΩ, an available frequency bandwidth of the conventional common source TIA 100 is about 2.45 GHz as shown in a graph $G_{100}$, while an available frequency bandwidth of the source follower TIA 400 is about 4.5 GHz as shown in a graph $G_{400}$. That is, the frequency bandwidth of the source follower TIA 400 of the present invention is larger than that of the conventional common source TIA 100 by about 2.05 GHz without any transimpedance gain loss.

In accordance with the present invention, the transimpedance gain of the source follower TIA 400 can be increased at the same frequency bandwidth by raising the resistance of the shunt feedback resistor 108 of the source follower TIA 400 shown in FIG. 2. That is, a greater gain-bandwidth multiplication of the source follower TIA 400 of the present invention is larger than that of the conventional common source TIA 100.

Figure 6:
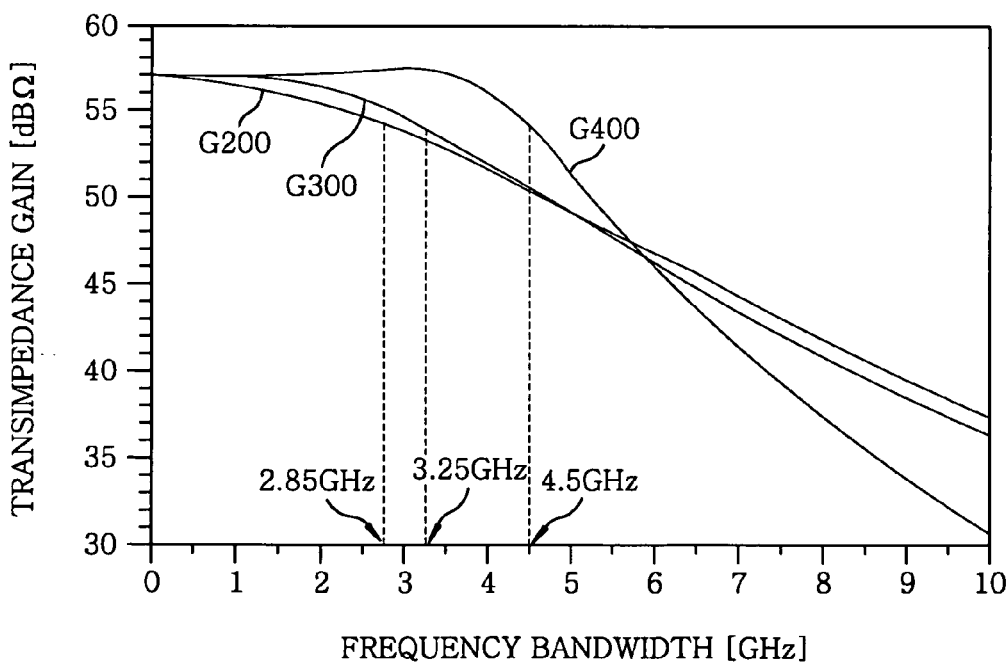
FIG. 6 presents graphs for illustrating a frequency bandwidth of a prior art shunt inductive-peaking TIA, a prior art capacitive-peaking TIA and the source follower TIA of the present invention, respectively.

FIG. 6 presents simulation results for illustrating frequency bandwidths of the prior art shunt inductive-peaking TIA, the prior art capacitive-peaking TIA and the source follower TIA 400 of the present invention, wherein the longitudinal axis represents a transimpedance gain [dBΩ] and the horizontal axis represents a frequency bandwidth [GHz].

For a transimpedance gain of 57 dBΩ, an available frequency bandwidth of the prior art shunt inductive-peaking TIA is about 2.85 GHz as shown in a graph $G_{200}$, while an available frequency bandwidth of the prior art capacitive-peaking TIA is about 3.25 GHz as shown in a graphs $G_{300}$. On the other hand, the source follower TIA 400 has an available frequency bandwidth of about 4.5 GHz for the transimpedance of 57 dBΩ as shown in a graph $G_{400}$.

That is, the gain-bandwidth multiplication of the source follower TIA 400 of the present invention is larger than those of the prior art shunt inductive-peaking TIA and the prior art capacitive-peaking TIA, without any transimpedance gain loss.

Meanwhile, the source follower TIA 400 using a FET (Field Effect Transistor) device having gate/source/drain has been described as the TIA in accordance with the present invention, but an emitter follower using a BJT (Bipolar Junction Transistor) having base/emitter/collector may be used.

Because no additional inductor and a capacitor are used therein, the source follower TIA 400 of the present invention has a smaller size than those of the prior art inductive-peaking TIA and the prior art capacitive-peaking TIA and is immune to a self-resonant frequency (SRF) and Q-value of on chip components unlike the prior art inductive-peaking TIA and the prior art capacitive-peaking TIA.

While the invention has been shown and described with respect to the preferred embodiments, it will be understood by those skilled in the art that various changes and modifications may be made without departing from the spirit and scope of the invention as defined in the following claims.

What is claimed is:

1. A transimpedance amplification apparatus with a signal source for generating a current signal, which comprises:
    a source follower stage having a source follower structure, for receiving the current signal to reduce an impedance of the signal source;
    a common source stage, following the source follower stage, driven by the reduced signal source impedance, for amplifying the current signal to extend a frequency bandwidth of the current signal and buffering the amplified signal with the extended frequency bandwidth thereof maintained, wherein the reduced signal source impedance serves to extend a frequency bandwidth of the common source stage; and
    a shunt feedback resistor, which is installed between the source follower stage and the common source stage, for adjusting an input DC bias of the source follower stage and increasing a transimpedance gain of the common source stage, wherein the common source stage includes:
    a first amplifying transistor for basically amplifying the current signal, wherein a gate thereof is connected to the source follower stage, while a drain thereof is coupled to a power supply and a source thereof is grounded;
    a first buffering transistor for buffering the basically amplified signal with the bandwidth thereof maintained, wherein a gate thereof is connected to the drain of the first amplifying transistor, while a drain thereof is coupled to a power supply and a source is grounded;
    a second amplifying transistor for secondarily amplifying the buffered signal, wherein a gate thereof is connected to the source of the first buffering transistor, while a drain thereof is coupled to a power supply and a source thereof is grounded; and
    a second buffering transistor for adjusting the output impedance to be a predetermined value and buffering the secondarily amplified signal while maintaining frequency bandwidth thereof, wherein a gate thereof is connected to the drain of the second amplifying transistor, while a drain thereof is coupled to a power supply and a source thereof is grounded.

2. The apparatus of claim 1, wherein the shunt feedback resistor is installed between a gate of the source follower stage and the drain of the first amplifying transistor.

3. The apparatus of claim 2, wherein the predetermined value of the output impedance is about 50 Ohm.

4. The apparatus of claim 1, wherein the first amplifying transistor has an input frequency magnitude $\omega_{in}$ as follows:

$$\omega_{in} = \frac{1}{R_S[C_{GS} + (1 + g_m R_D)C_{GD}]}, \quad \text{Eq. 1}$$

wherein $R_S$ is the signal source impedance; $C_{GS}$ is a capacitance between the gate and the source of the first amplifying transistor; $C_{GD}$ is a capacitance between the gate and the drain of the first amplifying transistor; $g_m$ is a transconductance of the first amplifying transistor; and $R_D$ is a drain resistance of the first amplifying transistor.

5. The apparatus of claim 4, wherein the source follower stage has an output impedance as follows:

$$Z_{out} = \frac{sR'_S C'_{GS} + 1}{g'_m + sC'_{GS}},$$

wherein $C_{GS}'$ is a capacitance between the gate and the source of the source follower stage; $g_m'$ is a transconductance of the source follower stage; and "s" is a complex frequency parameter.

6. The apparatus of claim 5, wherein each transistor is a FET (Field Effect Transistor) device.

7. The apparatus of claim 5, wherein each transistor is a BJT (Bipolar Junction Transistor) device.

* * * * *